US007715938B2

(12) United States Patent
Gilbert et al.

(10) Patent No.: US 7,715,938 B2
(45) Date of Patent: May 11, 2010

(54) METHOD AND SYSTEM FOR PREDICTIVE MODELING OF ARTICLES, SUCH AS TAMPONS

(75) Inventors: Steven Ray Gilbert, Fairfield, OH (US); Fredrick William Gibson, Liberty Township, OH (US); Richard William Hamm, Cincinnati, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 0 days.

(21) Appl. No.: 11/636,170

(22) Filed: Dec. 8, 2006

(65) Prior Publication Data

US 2008/0140368 A1    Jun. 12, 2008

(51) Int. Cl.
*G06F 19/00*    (2006.01)
(52) U.S. Cl. .......................................... 700/119; 703/9
(58) Field of Classification Search ......... 700/119–120; 264/401; 345/420; 604/1, 11, 15, 16–17, 604/385.17; 703/9; 702/1
See application file for complete search history.

(56) References Cited

U.S. PATENT DOCUMENTS

| | | | | |
|---|---|---|---|---|
| 5,389,068 | A | * | 2/1995 | Keck ........................... 604/15 |
| 5,601,542 | A | * | 2/1997 | Melius et al. ............... 604/368 |
| 6,122,008 | A | * | 9/2000 | Komobuchi et al. ......... 348/312 |
| 6,430,993 | B1 | | 8/2002 | Seta |
| 6,475,418 | B1 | * | 11/2002 | Tsai et al. ................... 264/143 |
| 6,630,093 | B1 | * | 10/2003 | Jones .......................... 264/401 |
| 6,691,566 | B2 | | 2/2004 | Iwasaki et al. |
| 6,730,057 | B2 | * | 5/2004 | Zhao et al. ..................... 604/11 |
| 6,743,212 | B1 | * | 6/2004 | Cole et al. ............. 604/385.17 |
| 6,810,300 | B1 | | 10/2004 | Woltman et al. |

(Continued)

FOREIGN PATENT DOCUMENTS

EP    0 668 711 B1    9/2002

(Continued)

OTHER PUBLICATIONS

"Unified Compaction/Dilation, Strain-Rate Sensitive, Constitutive Model for Rock Mechanics Structural Analysis Applications" Fossum et al., Gulf Rocks 2004, the 6th North America Rock Mechanics Symposium (NARMS), Rock Mechanics Across Borders and Disciplines, held in Houston Texas, Jun. 5-9, 2004.

(Continued)

*Primary Examiner*—Kidest Bahta
(74) *Attorney, Agent, or Firm*—Amanda T. Barry; David M. Weirich

(57) ABSTRACT

A modeling method for predictive modeling of a product, which may be but one example of a family of such modeling methods, includes receiving one of a processing condition of a process used to make a fibrous material into the product or a measurement of a property of the fibrous material or the tampon product, and calculating a virtual outcome from the one of the processing condition or the measurement received. The virtual outcome is one or more of not physically measured or not physically measurable, and has a relationship to the processing condition and a relationship to the measurement. The method also includes providing a measurement if the processing condition is received or a processing condition if the measurement is received, according to the virtual outcome calculated. A computing device may be programmed to carry out the method.

36 Claims, 7 Drawing Sheets

U.S. PATENT DOCUMENTS

| | | | |
|---|---|---|---|
| 6,837,882 B2 * | 1/2005 | Agyapong et al. | 604/385.17 |
| 7,099,734 B2 | 8/2006 | Pieper et al. | |
| 7,136,790 B1 | 11/2006 | Hobbs et al. | |
| 2004/0236455 A1 | 11/2004 | Woltman et al. | |
| 2004/0236457 A1 | 11/2004 | Stabelfeldt et al. | |
| 2004/0236552 A1 | 11/2004 | Pieper et al. | |
| 2005/0264561 A1 | 12/2005 | Anast et al. | |
| 2005/0264562 A1 | 12/2005 | Macura et al. | |
| 2005/0264563 A1 | 12/2005 | Macura et al. | |
| 2005/0264572 A1 | 12/2005 | Anast et al. | |
| 2005/0267613 A1 | 12/2005 | Anast et al. | |
| 2005/0267614 A1 | 12/2005 | Looney et al. | |
| 2005/0267615 A1 | 12/2005 | Lavash et al. | |

FOREIGN PATENT DOCUMENTS

| | | | |
|---|---|---|---|
| WO | WO2005/088488 A1 * | 9/2005 | |

OTHER PUBLICATIONS

"Implicit numerical integration of a three-invariant, isotropic/kinematic hardening cap plasticity model for geomaterials" Foster et al., Comput, Methods Appl. Mech Engrg 194 (2005) 5109-5138.

"Mechanics of inelastic deformation and delamination in paperboard", Xia, Submitted to the Department of Mechjanical Engineering in partial fulfillment of the requirements for the degree of Doctor of Philosophy in Mechanical Engineering, Massachusetts Institute of Technology, Feb. 2002.

"Out the Out-of-Plane Mechanical Behaviour of Paper Materials", Stenberg, Doctoral Thesis, Department of Solid Mechanics, Royal Institute of Technology, Stockholm 2002.

U.S. Appl. No. 11/598,335, filed Nov. 13, 2006, Macura et al.

U.S. Appl. No. 11/504,992, filed Aug. 16, 2006, Allende-Blanco et al.

U.S. Appl. No. 11/504, 993, filed Aug. 16, 2006, Allende-Blanco et al.

* cited by examiner

METHOD AND SYSTEM FOR PREDICTIVE MODELING OF ARTICLES, SUCH AS TAMPONS

FIELD OF THE INVENTION

The present disclosure generally relates to a method and system for modeling articles, including a computerized method and system for predictive modeling of such articles.

BACKGROUND OF THE INVENTION

In an exemplary manner, one may consider a product, for instance, a tampon. Generally, a tampon is a piece of fibrous material that is shaped to be insertable into a body cavity, such as, for example, a vagina or a nasal cavity. According to certain embodiments, the tampon is disposed in a tube-shaped applicator prior to use, although an applicator need not be included in all applications. Typically, the user positions the tampon in the appropriate body cavity, and then disposes of the applicator, if used.

Despite the fact that tampons have been in use for years, advancements in the materials and the processes used to make tampons have generally come about as a consequence of experimental "trial and error." That is, to the extent that one may believe that a new material or a variation in a process condition may lead to a superior tampon product, the conventional method has been to fabricate a tampon using the new material or process step, and then subject the tampon thus fabricated to testing. The testing typically has been qualitative in nature, and success or failure may be based on little more than the volume of liquid absorbed. If testing does not bear out initial optimism, then the designer would start the process anew with a different material or process variation.

Even if testing suggests that the tampon made using the new material or the new process may be superior to past tampons, not every such improvement necessarily results in a commercially feasible product. A design considered successful under laboratory conditions might prove difficult or expensive to fabricate under actual processing conditions or when manufactured using conventional fabrication equipment. Therefore, even if the design showed positive performance under test conditions, the designer might have to start over from scratch after field trials are performed.

This type of iterative design process is expensive in terms of money, material and time.

Accordingly, it would be desirable to provide a system or a method that simulates behavior of the fibrous material that is made into a tampon. It would be desirable to provide a system or a method that simulates behavior of fibrous material that is made into a tampon by way of a computer model. In a more general sense, it would be desirable to have a method and system for modeling materials that are made into a variety of products, of which the tampon is but one product. It would also be desirable to provide a system or a method that provides values that could be used to determine the process characteristics that would provide a given measurement in the finished product, or determine the measurements in the finished product for a change in a process characteristic.

SUMMARY OF THE INVENTION

In one aspect, a modeling method for predictive modeling of a tampon product includes receiving one of a processing condition of a process used to make a fibrous material into the tampon product or a measurement of a property of the fibrous material or the tampon product, and calculating a virtual outcome from the one of the processing condition or the measurement received. The virtual outcome is one or more of not physically measured or not physically measurable, and has a relationship to the processing condition and a relationship to the measurement of the property of the fibrous material or the tampon product. The method also includes providing a measurement of a property of the fibrous material or the tampon product if the processing condition is received or a processing condition of a process used to make the fibrous material into the tampon product if the measurement of the property is received, according to the virtual outcome calculated.

In another aspect, a modeling system for predictive modeling of a tampon product includes a computing device, with a processor and a data storage device, and a constitutive model for the tampon product. The computing device is programmed to receive one of a processing condition of a process used to make a fibrous material into the tampon product or a measurement of a property of the fibrous material or the tampon product, and to perform simulations using the constitutive model to calculate a virtual outcome from the one of the processing condition or the measurement received. The virtual outcome is one or more of not physically measured or not physically measurable, and has a relationship to the processing condition and a relationship to the measurement of the property of the fibrous material or the tampon product. The computing device is also programmed to provide a measurement of a property of the fibrous material or the tampon product if the processing condition is received or a processing condition of a process used to make the fibrous material into the tampon product if the measurement of the property is received, according to the virtual outcome calculated.

In a further aspect, a modeling method for predictive modeling of a material that is made into a product, the method includes receiving one of a processing condition of a process used to make the material into the product or a measurement of a property of the material or the product, and calculating a virtual outcome from the one of the processing condition or the measurement received. The virtual outcome is one or more of not physically measured or not physically measurable, and has a relationship to the processing condition and a relationship to the measurement of the property of the material or the product. The method also includes providing a measurement of a property of the material or the product if the processing condition is received or a processing condition of a process used to make the material into the product if the measurement of the property is received, according to the virtual outcome calculated.

In a still further aspect, a modeling system for predictive modeling of a material that is made into a product includes a computing device, with a processor and a data storage device, and a constitutive model for the product. The computing device is programmed to receive one of a processing condition of a process used to make a material into the product or a measurement of a property of the material or the product, and to perform simulations using the constitutive model to calculate a virtual outcome from the one of the processing condition or the measurement received. The virtual outcome is one or more of not physically measured or not physically measurable, and has a relationship to the processing condition and a relationship to the measurement of the property of the material or the product. The computing device is programmed to provide a measurement of a property of the material or the product if the processing condition is received or a processing condition of a process used to make the material into the product if the measurement of the property is received, according to the virtual outcome calculated.

Additional aspects of the disclosure are defined by the claims of this patent.

BRIEF DESCRIPTION OF THE DRAWINGS

While the specification concludes with claims particularly pointing out and distinctly claiming the subject matter that is regarded as the present invention, it is believed that the invention will be more fully understood from the following description taken in conjunction with the accompanying drawings. Some of the figures may have been simplified by the omission of selected elements for the purpose of more clearly showing other elements. Such omissions of elements in some figures are not necessarily indicative of the presence or absence of particular elements in any of the exemplary embodiments, except as may be explicitly delineated in the corresponding written description. None of the drawings are necessarily to scale.

DETAILED DESCRIPTION OF THE INVENTION

Figure 1:
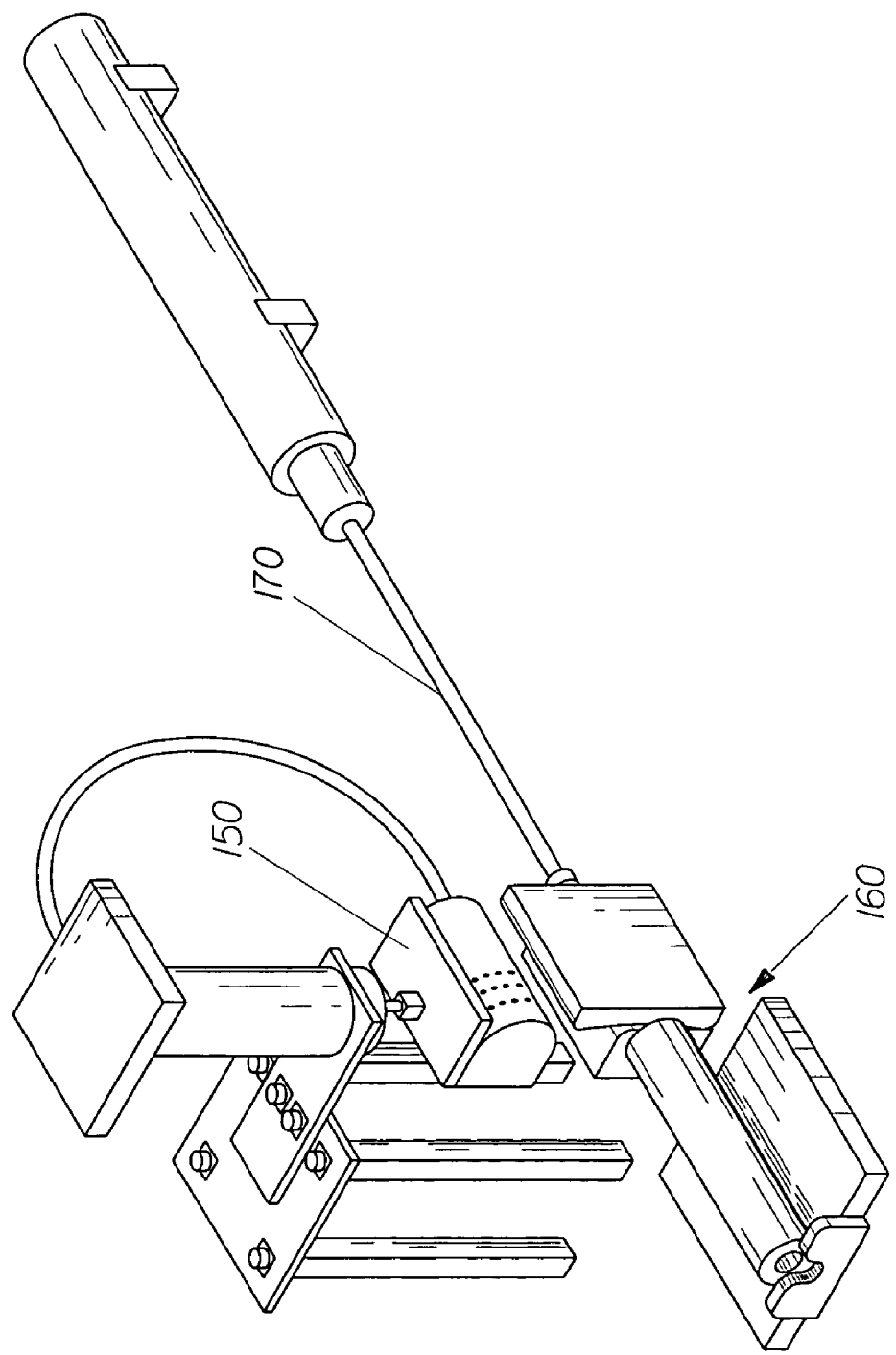
FIG. 1 is a perspective view of a compression machine, a push rod, and a joined sleeve cavity mold.
Figure 2:
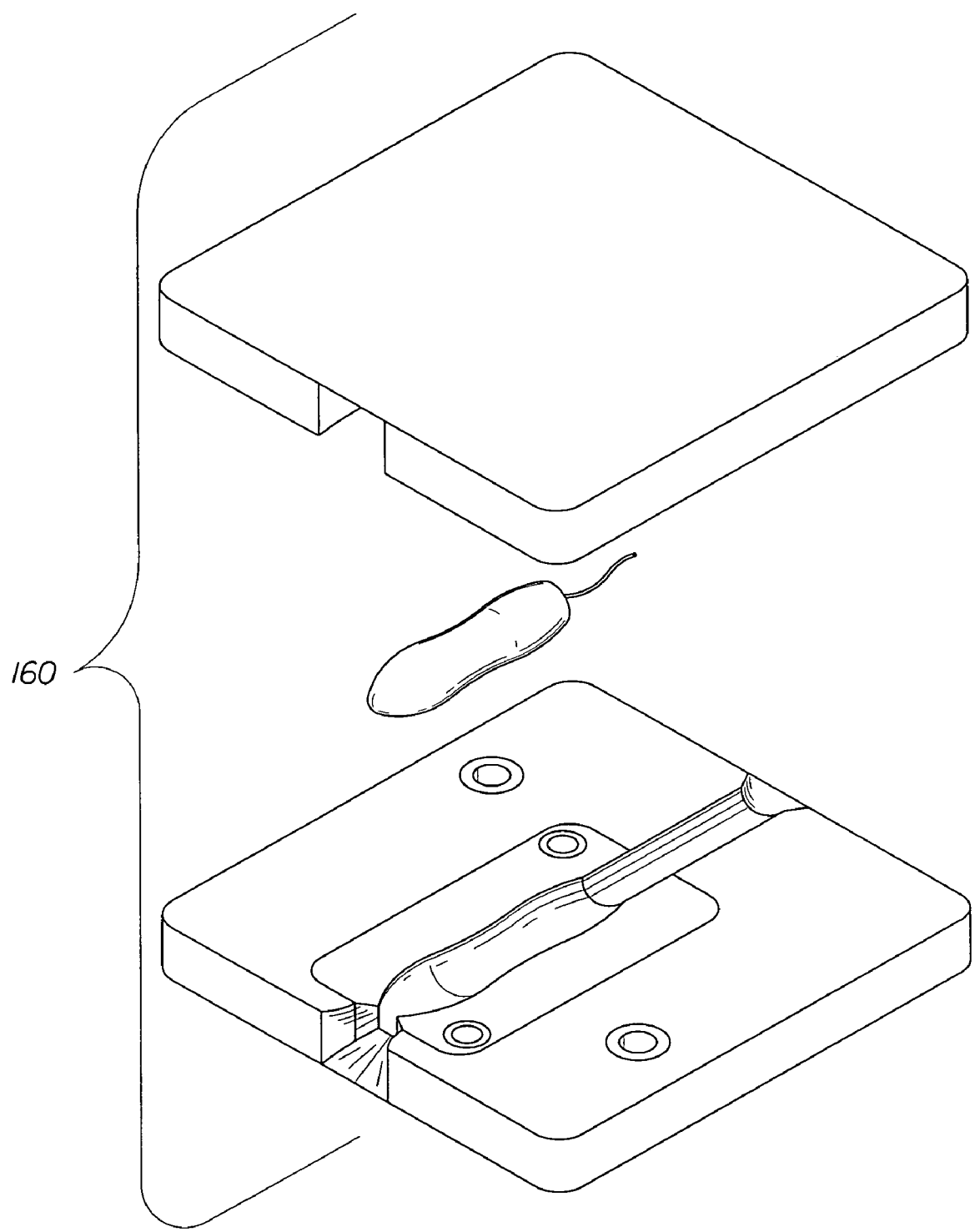
FIG. 2 is an exploded view of a split cavity mold.
Figure 3:
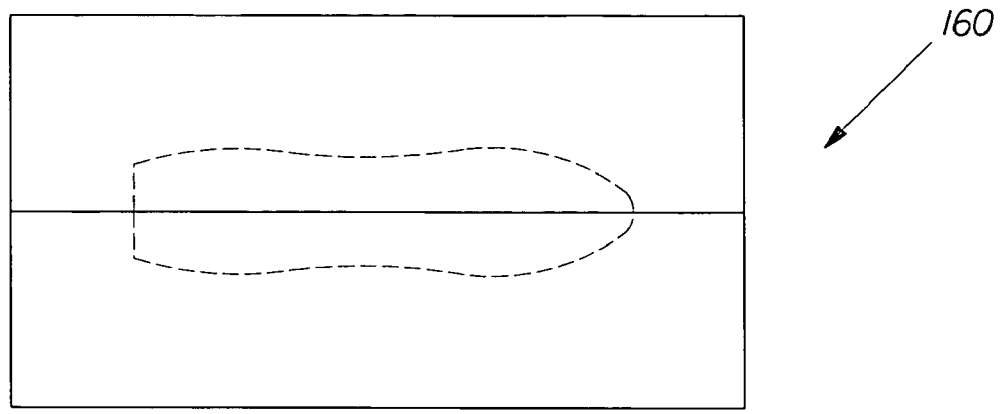
FIG. 3 is a side view of the split cavity mold.
Figure 4:
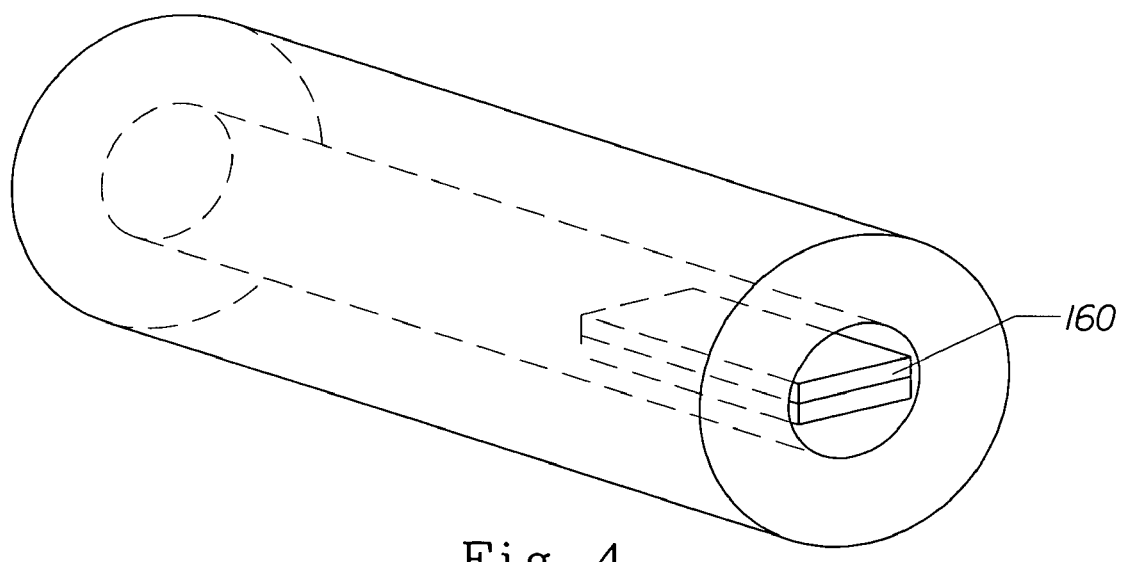
FIG. 4 is an enlarged, perspective view of the joined sleeve cavity mold.

An exemplary embodiment of a method for modeling materials for use in products, such as tampons, is first discussed with reference to FIGS. 1-5. According to this exemplary embodiment, a model is defined for a fibrous material that is made into a tampon product.

Thus it is that the method of defining a model for the fibrous material that is made into a tampon may involve certain preliminary steps and empirical steps. That is, in defining the model, the processes which the fibrous material undergoes and the conditions under which these processes are conducted may first be considered. As a consequence of this preliminary consideration, a series of tests may be outlined to gather measurements of the material under the conditions identified in the preliminary consideration (or test results). The test results may then be used to define a model, which may be a constitutive model, as explained in greater detail below. The model may include one or more coupled equations, which equations may be capable of being solved numerically. It may be desired to modify this model according to measurements taken during the testing, which modifications may be in the form of variations, including coefficients. The result of the process is a model defined for the fibrous material in question.

Therefore, as discussed above relative to the exemplary embodiment, initial consideration is given to the processes and environmental and process conditions under which the fibrous material is formed into a tampon. While certain ranges may be referred to herein, it will be recognized that the disclosure of the ranges should be understood to include the individual values within the ranges as well as subranges within the disclosed ranges. In fact, where subranges are particularly referenced, these subranges are disclosed for purposes of illustration, but not by way of limitation, of the broader ranges within which they are located.

The method of making a tampon generally begins with the pledget. As used herein, the terms "pledget" or "tampon pledget" are intended to be interchangeable and refer to a construction of absorbent material prior to compression of such construction into a tampon. Tampon pledgets are sometimes referred to as a tampon blank, a softwind, or a pad, and the term "pledget" is intended to include such terms as well.

The pledget may be of a variety of shapes, sizes, materials and constructions. For instance, the pledget may be rectangular, trapezoidal, triangular, semi-circular, chevron-shaped, H-shaped, bowtie-shaped, or cylindrical. The pledget may be constructed from a similarly wide variety of liquid-absorbing materials, including synthetic and natural fibers in woven and nonwoven materials, including cotton, rayon, polyester, polyethylene, polypropylene and combinations thereof. The pledget may also include incorporated materials, such as superabsorbent materials including superabsorbent polymers or gelling materials and the like. The pledget may be defined by a single material having a single density, or may be defined by a material with a varying density or thickness. Further, the tampon pledget may be of a laminar structure including at least one intermediate layer disposed between two outer layers. Further variants for the pledget are described in U.S. Publication Nos. 2003/0172504 and U.S. Pat. No. 6,740,070.

The tampon pledget may be go through a preliminary forming step, be compressed to form a substantially cylindrical form, and then set into the final product form in a mold.

In the preliminary forming step, the pledget may be rolled, spirally wound, or folded. Folding is characterized by at least one bend at least in a portion of the tampon pledget such that the relevant portion of the tampon pledget is positioned in a different plane than before, with the observation that the surface regions near the bend are in a different distal and angular relationship to each other after the folding has taken place. There may exist one or more bends of folds of generally 180 degrees such that the surface regions on either side of the bend may be juxtaposed or even in co-facial contact with each other.

The preliminarily-formed pledget may then be disposed into a compressing element. See FIG. 1. The compressing element is designed to compress the incoming pledget into a generally cylindrical shape. Compressing refers to pressing, compacting, or squeezing together or to reduce in size or volume as if by squeezing. The product of this process step is a fiber body with a high aspect ratio, i.e., a shape in which the length is greater than the diameter or width of the shape; this product may or may not contain defined circles or arcs.

For example, with reference to FIG. 1, compression may be accomplished by placing the pledget into a compression jaw 150, which may be referred to as a cross-die for flat pledgets. Initially, inner surface of the first and second pieces are spaced relative to each other. When the compression jaw is actuated, the first and second pieces are moved so that the inner surfaces are no longer spaced, but are generally abutting each other, with the preliminary-formed pledget disposed between the two pieces. The movement of the jaw may take about 0.2 seconds or less. As mentioned above, the pledget is compressed into a fiber body having a high aspect ratio shape, although other shapes are possible (e.g., rectangular, triangular, trapezoidal, and semi-circular).

A typical cross die will typically have an open width of between about 50 and about 120 mm, and close to between about 10 and about 18 mm. The tampon pledget may have a lateral dimension of between about 50 and about 80 mm aligned to the closing direction of the cross die. Thus, closure will strain the pledget in this direction between about 25 and about 85%, more typically between about 50 and about 85%, or even between about 70 and about 85%. For typical tampon making rates, the accompanying compression rate can be between about 350 and about 600 mm/s, which can translate into a strain rate of between about 6/s and about 17/s. The pledget density of about 0.05 to about 0.1 g/cc will thus increase to between about 0.3 and about 0.5 g/cc for the cylindrically shaped compressed fiber body, in a typical application.

The fiber body may then be transferred into a tampon-forming mold, although a fixed-pressure device could also be used. See FIGS. 2 and 3. In the forming mold, the tampon sets to a desired shape and dimension, such that the final tampon is able to remain in a self-sustaining form. The ability to remain in a self-sustaining form refers to the degree to which the tampon retains the compression applied to the absorbent material of the tampon pledget such that in the subsequent absence of the external forces, the resulting tampon will retain its general shape and size. For example, the resulting tampon's total volume growth subsequent to removal of the external forces may be no greater than about 50% of the external force-restrained shape. According to certain embodiments, growth may be less than about 25%, while in still other embodiments is may not exceed about 10% of the external force-restrained shape when observed at ambient room conditions of about 22 C-24 C and about 50% relative humidity.

The compressed fiber body is transferred into the transfer end (or ingress port) of a mold 160, for example a split cavity mold (see FIGS. 1-4), using a transfer member 170, such as a push rod (see FIG. 1), which may affect the transfer in about 0.2 seconds or less. A pushrod will generally be sized smaller than the cross die and mold diameters, and may be shaped on the tip. In addition to transferring the fiber body to the mold 160, the pushrod 170 may be used to axially compress the tampon in the mold. For a typical process, and laterally compressed fiber body may start with an initial length of between about 40 and about 100 mm, and be axially compressed within the mold 60 to between about 25 and about 50 mm, resulting in a strain of between about 25 and about 75%. At typical tampon making rates, the pushrod will create a compression rate of about 500 mm/s, which may translate into a strain rate of between about 4/s and about 14/s. Given the annulus formed between the push rod and the cross die and mold parts, shearing may also occur within the material.

While sometimes that tampon can become self-sustained under the pressures and constraints of the mold itself, the process may be conducted under controlled temperature conditions to assist the process. Specifically, the setting of the tampon may be assisted by the introduction of heat, which heat-setting may occur while the tampon is at least partially inside the mold. The heat may be introduced by one method or another, e.g., thermal temperature gradient conduction, microwave heating, radio-frequency heating, infrared heating, gas heating (hot air, steam) etc. Typical header (conductive heating) temperatures are about 260 C, and the header (not shown) may be in contact with the end of the fiber body for between about 0.1 and about 0.15 seconds. Moreover, the mold temperature may be between about 130 C and about 170 C for about 15 seconds. The consequence of the heating step may be that the temperature of the fiber is between about 25 C and about 200 C.

In addition to the heating, moisture may be added. As a consequence, the heat-setting may be accompanied by control of the internal moisture of the tampon, either through pre-humidification or pre-drying, to control the overall resultant self-sustaining behavior of the tampon. For example, steam may be introduced for between about 0.5 and about 1 second. The steam will add between about 1 and about 3% moisture to the tampon in the first 0.5 second. Thereafter, the moisture added may dissipate through further steam treatment and subsequent heating periods. Fiber moisture levels of between about 5% and about 15%, on a dry weight basis, are desirable.

Thus, in summary, the range of densities of the pledget/tampon throughout the processing of the material may be generally between about 0.05g/cc and about 0.8 g/cc, although, in zones, the density may vary significantly from that in other zones, and may assume values above about 1.0 g/cc. Pledgets that begin at a lower density range of nominally about 0.05 g/cc to about 0.1g/cc may be strained to a higher density on average because of the processing steps, such as with lateral compression and axial compression steps. The density even beyond the final density if overcompressing is utilized. In such cases, the density may approach higher levels, 0.6 g/cc to 0.8 g/cc, for example, and then decrease to some lower value, 0.4 g/cc to 0.6 g/cc, for example, as the fiber rebounds from the overcompression. Maximum densities through the process can thus be achieved because of overcompression coupled with localized zones of density that can result in densities above 1.0 g/cc.

From these preliminary considerations, it may be determined that the fibrous material experiences loading in tension, compression and shear as it is formed into a tampon. It may also be determined that moisture, temperature and processing rate are significant for consideration in the definition of the general form of the model and for any variations to the general model. Thus, it may be determined that the fibrous material should be tested for mechanical response (i.e., stress, strain) under tensile, compressive, and shear loadings, with variations in moisture, temperature, and rate conditions. In fact, one or more test matrices may be prepared to guide the testing.

As one such example, the following test matrix may be used to obtain measurements of a tampon-making material under a controlled moisture and temperature conditions.

| Test mode | Strain (in %) | Material Types | Reps | Total Tests |
| --- | --- | --- | --- | --- |
| Tension, TD | 5, 10, 15, 20, 25, 30, 35, 40, 45, 50 | 6 | 3 | 18 |
| Tension, MD | 5, 10, 15, 20, 25, 30, 35, 40, 45, 50 | 6 | 3 | 18 |
| Tension, Out of Plane | 20, 40, 50, 60, 70, 80, 90 | 6 | 3 | 18 |
| Comp., TD | 20, 40, 50, 60, 70, 80, 90 | 6 | 3 | 18 |
| Comp., MD | 20, 40, 50, 60, 70, 80, 90 | 6 | 3 | 18 |
| Comp., Out of Plane | 20, 40, 50, 60, 70, 80, 90 | 6 | 3 | 18 |
| Shear, TD, 20% Comp. | 20, 40, 50, 60, 70, 80, 90 | 6 | 3 | 18 |
| Shear, TD, 50% Comp. | 20, 40, 50, 60, 70, 80, 90 | 6 | 3 | 18 |
| Shear, TD, 85% Comp. | 20, 40, 50, 60, 70, 80, 90 | 6 | 3 | 18 |
| Shear, MD, 20% Comp. | 20, 40, 50, 60, 70, 80, 90 | 6 | 3 | 18 |
| Shear, MD, 50% Comp. | 20, 40, 50, 60, 70, 80, 90 | 6 | 3 | 18 |
| Shear, MD, 85% Comp. | 20, 40, 50, 60, 70, 80, 90 | 6 | 3 | 18 |

In this table, TD is Transverse Direction, MD is Machine Direction, Comp. is Compression, and Out of Plane refers to the thickness or z-direction. The measurements would be taken at room temperature (about 22 C-24 C).

It will be recognized that similar or other measurements could be taken at varying moisture conditions (contents) and at varying thermal conditions (temperatures). Further, it will be recognized that similar measurements could be taken for a variety of processing conditions at a variety of rates.

For example, the following test matrix may be used to obtain measurements with shear as a function of compression for a tampon-making material at varying moisture conditions:

| Test mode | Strain (in %) | Moisture (in %) |
|---|---|---|
| Shear, TD, 20% Comp. | 20, 40, 60, 80, 90 | 5, 10, 15 |
| Shear, TD, 50% Comp. | 20, 40, 60, 80, 90 | 5, 10, 15 |
| Shear, TD, 85% Comp. | 20, 40, 60, 80, 90 | 5, 10, 15 |
| Shear, MD, 20% Comp. | 20, 40, 60, 80, 90 | 5, 10, 15 |
| Shear, MD, 50% Comp. | 20, 40, 60, 80, 90 | 5, 10, 15 |
| Shear, MD, 85% Comp. | 20, 40, 60, 80, 90 | 5, 10, 15 |

In this table, TD is Transverse Direction, MD is Machine Direction, and Comp. is Compression. The measurements may be taken at room temperature (about 22 C-24 C), although the same tests may be performed at other temperatures, or at a plurality of different temperatures, as desired, to generate additional test results. Preferably, a fresh sample may be used at each moisture level (and at each temperature level, if more than one temperature level is used), although the same sample may be used over the included range of strain values, with the sample run to gradually increasing levels of strain.

The moisture content may be determined according to the following fashion. A series of experiments may be performed on the sample material to determine an adsorption curve and a desorption curve for the material, thereby generating a sorption isotherm for the material. These experiments may be conducted at a single temperature, or a plurality of temperatures. From the sorption isotherm, approximate humidity settings may be determined to result in an about 5%, 10%, or 15% moisture content in the material at equilibrium. The sample may then be conditioned in a humidity chamber at the desired humidity setting prior to use in the testing. Other methods may be used in the alternative.

As another example of the other measurements possible, the following test matrix may be used to obtain stress relaxation measurements for a tampon-making material at varying thermal conditions, strains and moisture conditions:

| Test mode | Temperature (in C.) | Strain (in %) | Moisture (in %) |
|---|---|---|---|
| Shear | RT, 60, 90, 150 | 10, 50, 90 | 5, 10, 15 |
| Comp., Out of Plane | RT, 60, 90, 150 | 10, 50, 90 | 5, 10, 15 |
| Comp., Axial | RT, 60, 90, 150 | 10, 50, 90 | 5, 10, 15 |

In this table, Comp. is Compression, Out of Plane refers to the thickness or z-direction, and RT is room temperature (about 22 C-24 C). As to the thermal conditions, the material may be permitted to equilibrate at the desired temperature (RT, 60 C, 90 C, or 150 C) before the measurements are taken. As to the moisture conditions, this method described above may be used to obtain the desired moisture content. As to the measurements themselves, these may be taken at regular time intervals once the material has been permitted to equilibrate at the desired temperature and moisture, for a total elapsed time of 60 seconds. Alternatively, elapsed times other than 60 seconds may be used. Preferably, a fresh sample may be used at each level of temperature, moisture or strain.

Based on the foregoing, a general form of a constitutive model with one or more behaviors may be defined. For example, the model may include the following behaviors: viscoelasticity, viscoplasticity, thermal dependency, moisture dependency, compaction (densification) and damage. Based on these behaviors, a set of coupled, nonlinear partial differential equations may be assembled, which equations may be solved numerically (by return mapping or cutting plane algorithms, for example) to determine the state of stress for an arbitrary deformation path.

According to one embodiment, the model may include, for example, equations relating stress and deformation or stress rate and rate of deformation, which equations may be further refined to account for viscoelasticity. The model may also include equations defining a yield criterion that delineates the elastic and plastic regions in stress space. Further, the model may include equations defining a plastic flow rule, which determines the amount of plastic deformation. Further, evolution equations may be included in the model.

Starting with the equations relating stress and deformation or stress rate and rate of deformation, while the present disclosure should not be limited to one approach or the other, it is believed that the relation between stress rate and rate of deformation may be easier to address, both theoretically and numerically. Such a relation between rates may be referred to as a hypoelastic law, and where, as here, the focus is on finite deformation, the law may be cast in terms of an objective stress rate to satisfy the objectivity requirement. For example, the Corrotational rate may be used.

Deformation may be expressed as the additive decomposition of a second order rate-of deformation-tensor, or:

$$\tilde{D} = \tilde{D}^e + \tilde{D}^p + \tilde{D}^T + \tilde{D}^M$$

where $\tilde{D}$ is the rate-of-deformation tensor, which may be considered equivalent to strain rate in the infinitesimal strain case, and $\tilde{D}^e$, $\tilde{D}^p$, $\tilde{D}^T$, and $\tilde{D}^M$ are the elastic, plastic, thermal and moisture components of the rate-of-deformation tensor, $\tilde{D}$. Further, the thermal and moisture components, $\tilde{D}^T$ and $\tilde{D}^M$, may be expressed as general functions, $f$ and g, respectively, which functions may include matrices of expansion and coupling coefficients, or $\tilde{D}^T = f(T_{ref}, T, \dot{T})$ and $\tilde{D}^M = g(T_{ref}, M, \dot{M})$.

Having defined deformation, the stress rate relation may be expressed as:

$$\tilde{\sigma}^\nabla = \tilde{M}^{-1} : \tilde{C} : \tilde{D}^e = \tilde{M}^{-1} : \tilde{C} : (\tilde{D} - \tilde{D}^p - \tilde{D}^T - \tilde{D}^M)$$

where $\tilde{\sigma}^\nabla$ is the objective rate of the stress tensor, $\dot{M}$ is the damage effect tensor, and $\tilde{C}$ is the stiffness matrix. The damage effect tensor would be a fourth order tensor for complete anisotropy, whereas the damage effect tensor would be a scalar for isotropic damage; according an embodiment of the present disclosure, isotropic damage that includes a tension cut-off may be used. The stiffness matrix may be a function of temperature, moisture and stress. To account for viscoelasticity, the stress rate may be expressed as:

$$\tilde{\sigma}(t) = \tilde{\sigma}^\circ(t) - \Sigma \tilde{q}_k$$

where $\tilde{\sigma}(t)$ is the final rate dependent response of the material at time t, $\tilde{\sigma}^\circ(t)$ is the instantaneous response of the material at time t determined from the integration of the equation for $\tilde{\sigma}^\nabla$, above, and $\Sigma \tilde{q}_k$ is a series of viscoelastic relaxations, where each term is a solution to the following differential equation:

$$\frac{\partial \tilde{q}_k}{\partial t} + \frac{1}{\tau_k}\tilde{q}_k = \frac{\gamma_k}{\tau_k}\tilde{\sigma}^\circ(t)$$

with $\gamma$ being a relaxation parameter and $\tau$ being the time constant.

Having thus defined the relation between stress rate and rate of deformation, the yield criterion may also be defined. According to one embodiment, the yield may be defined as a superposition of individual yield criteria:

$$f = \Sigma f_i = \Sigma Y_i(\tilde{\sigma} - \tilde{X}, R)$$

where $Y_i$ is the functional form of the yield, $\tilde{X}$ is back stress tensor, kinematic hardening metric, and R is the isotropic hardening factor. $\tilde{X}$ may itself be expressed as $\tilde{K}:\tilde{\alpha}$, where $\tilde{\alpha}$ is the back strain tensor. Additionally, R may be expressed as $R^A + R^B$, where $R^A$ is the metric of yield surface size and $R^B$ is the coupling term with the back stresses (or $f(\tilde{X}^2)$).

Further, a flow rule may be defined. The flow rule, which may determine the amount of plastic deformation, may be given as:

$$\tilde{D}^p = \Sigma \tilde{H}_i \lambda_i \tilde{n}_i$$

where $\tilde{H}_i$ is a model-dependent homogenization term, $\lambda_i$ is a scalar metric of plastic strain, and $\tilde{n}_i$ is the normal to yield surface. $\tilde{n}_i$ may be expressed as:

$$\frac{\partial f_i}{\partial \tilde{\sigma}}$$

where $f$ is the yield criterion and $\tilde{\sigma}$ is stress. Thus, the "i" subscript simply indicates that it is a term in a series, and does not reference a tensorial direction. According to an embodiment of the present disclosure, $\lambda_i$ may take the form of a Norton or hyperbolic sine creep law to account for rate dependent plasticity, although it will be recognized that other creep laws may be used.

In addition, evolution equations may be defined. In particular, the evolution may be kinematic hardening evolution, formulated as a modification of the standard Armstrong-Fredrick kinematic hardening model to include non-symmetric compressive loading and unloading behavior (i.e., the back and forth motion of the kinematic variables). Thus, the material parameter matrices may be related as:

$$\dot{\tilde{\alpha}} = \tilde{B}\tilde{D}^P - \lambda\tilde{N}\tilde{\alpha} \text{ (loading), and}$$

$$\dot{\tilde{\alpha}} = \tilde{B}'\tilde{D}^P - \lambda\tilde{N}'\tilde{\alpha} \text{ (unloading)}$$

With respect to the above equations, loading is characterized as $\text{Sign}(\dot{\tilde{\alpha}}) = \text{Sign}(\tilde{D}^P)$. Otherwise unloading conditions are assumed. Relative density, d, which enters into the damage effect tensor and is related to the Jacobian of the deformation tensor, is described by the integration of the following:

$$d = (1-d)\int Tr[\tilde{D}^P]dt$$

With the model thus defined, simulations may be performed using the model, and a determination may be made, in a general sense, as to whether the model is appropriate. If not, adjustments may be made, for example, through the introduction of additional behaviors and/or couplings. Even if the model produces results that suggest that the model has included behaviors and couplings to represent the material in a general sense, it may be desired to further refine the model. That is, results of simulations conducted using the model may be compared against the test results gathered during the testing phase to determine if variations are required to the model, as opposed to incorporation of additional behaviors, for example. For example, the variations, in the form of coefficients, may be introduced into the deformation equation through the thermal and moisture components, $\tilde{D}^T$ and $\tilde{D}^M$. This phase also may be an iterative process, in that simulations may suggest modifications, with further testing performed as a consequence.

Figure 5:
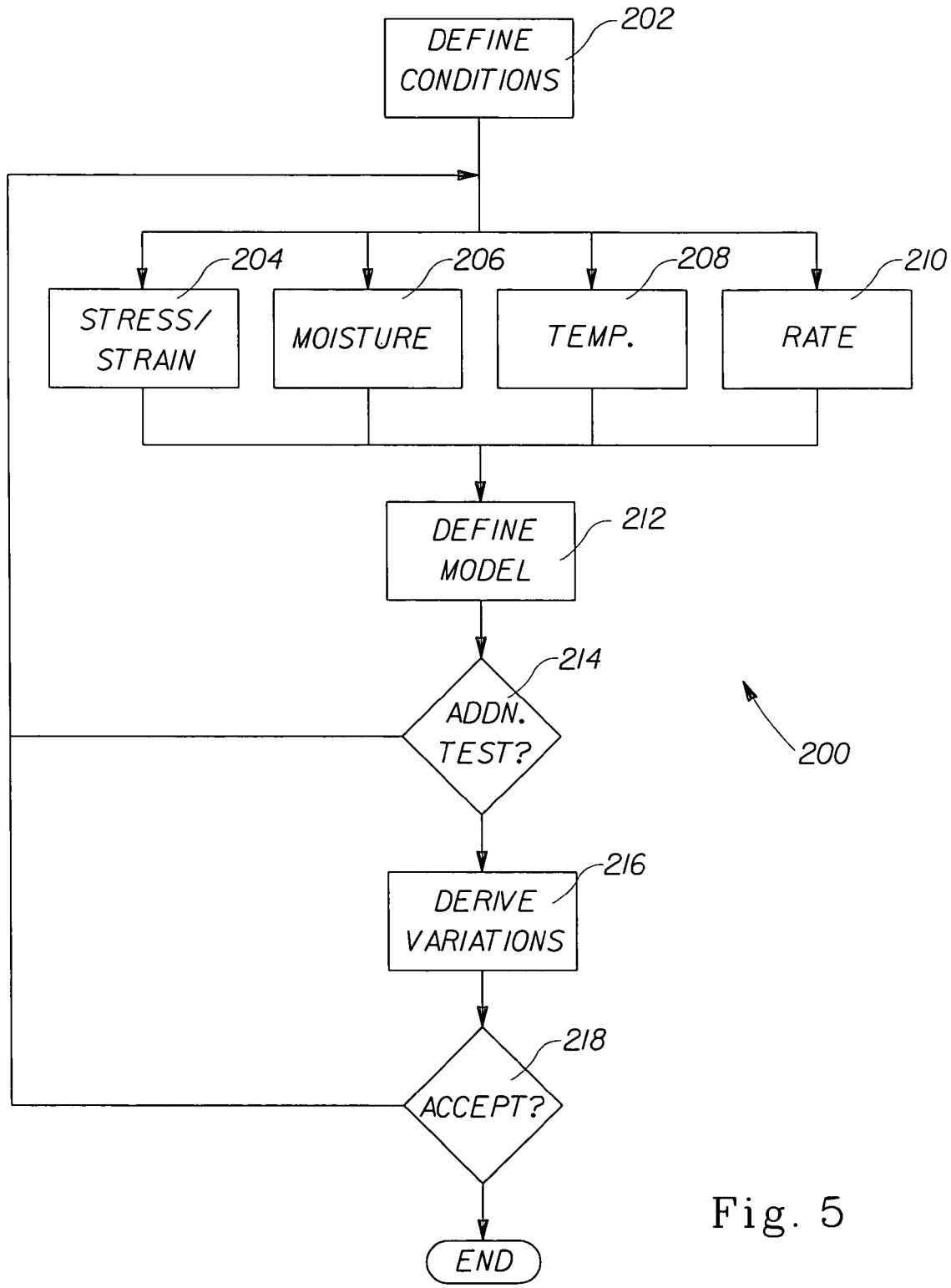
FIG. 5 is a flowchart of a method to model a material that is made into a tampon product.

Thus, as represented in FIG. 5, the modeling method 200 for a tampon product starts at block 202, where the above-mentioned processes and conditions may be analyzed to determine conditions for further testing. In this consideration, it may be determined that moisture, temperature and processing rate may have an effect, and should be tested. From this, consideration, one or more test matrices may be prepared to guide the testing. As is suggested by blocks 204, 206, 208, 210, the testing as to mechanical properties (stress, strain), moisture, temperature and rate may be conducted in no particular order, and may in fact be conducted simultaneously.

The method 200 continues at block 212 with the definition of the model. The model may be a constitutive model in the form of a set of coupled, nonlinear partial differential equations, as explained in greater detail above. In the process of formulating the model, or even after certain preliminary selections have been made of equations to be included in the set that defines the model, it may be determined, as reflected at block 214, that additional tests are required. For example, it may be determined, after performing simulations using the model formulated at block 212, that additional data is required as to the conditions previously tested, or may even suggest the inclusion of conditions not previously included at blocks 206, 208, 210.

Even if the model is determined to be acceptable in a general sense, the method 200 may continue to block 216, wherein variations are considered for the model such that simulations run using the model have a higher degree of agreement with the test results. As noted above, the variations represent the functional relationships between temperature, rate, and moisture and the thermal and moisture components of the rate-of-deformation tensor. Other variations are possible. Even after variations are proposed, the method 200 may continue to block 218, wherein it is determined if the model, as modified, is acceptable. If the model is not acceptable, further testing may be conducted at blocks 204, 206, 208, 210. If the model it acceptable, then the modeling method may be ended.

Figure 6:
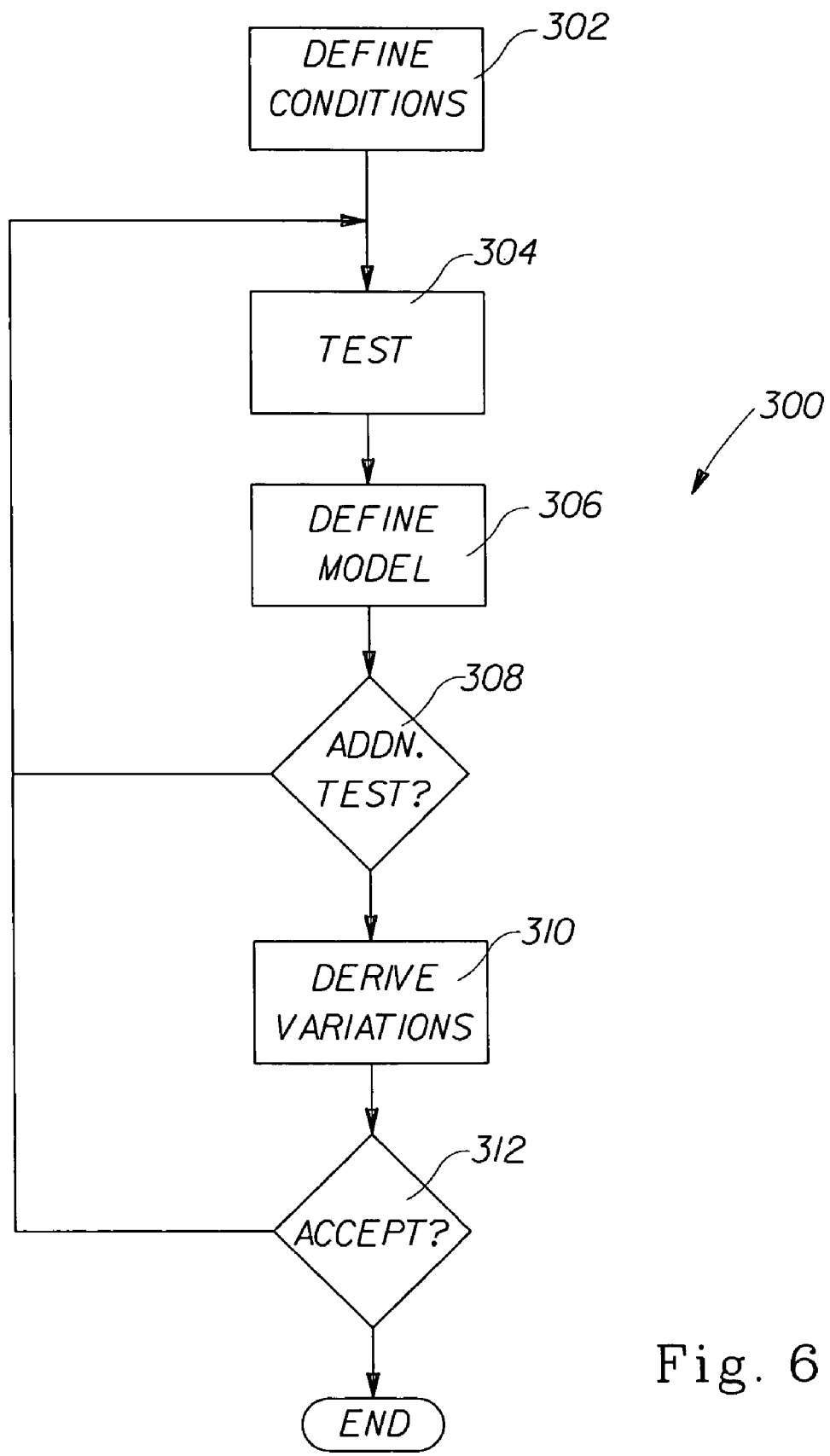
FIG. 6 is a flowchart of a method to model a material that is made into a product.

From the more specific method 200, a general method 300 for the modeling of a material that is made into product may now be discussed relative to FIG. 6.

The general method 300 may be used for any of a variety of articles or products, including the tampon product discussed in above as an exemplary embodiment. The method 300 may, however, be used for flat sheets and other finished geometries besides the tampon product. For example, the starting material need not be in the form of a flat sheet. Likewise, the method 300 may be used for modeling materials to be made into feminine hygiene products, in a general sense. For that matter, the method 300 may be used for modeling materials to be made into absorbent articles, regardless of their specific function or use. In this regard, the articles may be diapers, training pants, etc.

Nor is the method 300 only limited in its usefulness to fibrous materials, but may be useful for foam and other materials as well. Moreover, the method 300 may be used with materials that have a homogeneous composition, or a heterogeneous composition where the aggregate macroscale constitutive response is of interest. Further, the materials may refer to an assembly of individual materials, which assembly may be in the form of a composite or a laminate, for example, in which case it may be necessary to define more than one constitutive model or to use homogenization techniques. An assembly of materials may also be defined by individual materials that are joined, coupled or grouped together in some fashion other than permanent or semi-permanent bonding, through the use of an adhesive or resin, for example.

The method 300 begins at a block 302, wherein the product which will be made from the material and the product's method of manufacture are analyzed to define the conditions under which the product is used, formed, assembled, etc.: i.e., the processing conditions. Included within this analysis may be use of the product, from which product-driven or product-performance-driven conditions may be derived. Also including within this analysis is consideration of the processes or activities that are used to form the product. For instance, consideration may be given as to whether the material is cut or punched, folded or rolled, compressed or expanded, etc. Further, consideration may be given as to whether these activities are conducted at constant environmental conditions (temperature, moisture, etc.) or process conditions (speed, rate, force, etc.), or if the environmental conditions or process conditions vary over time. Consideration may also be given as to the order of the process steps or activities. Still other factors may be considered as well.

The method 300 then proceeds to a block 304. At the block 304, testing is conducted and measurements are made at the various conditions defined at block 302. For example, the mechanical properties of the material, such as stress and strain, may be measured with the material in tension, compression or shear. For that matter, measurements may be made over a range of temperatures, moisture levels, strain rates, etc., according to the conditions defined in block 302. A test matrix may be formed, as is explained above, to assist in organizing the testing to provide a suitable set of measurements for further analysis.

The method 300 may then pass to a block 306. Reviewing the measurements made at block 304, the model is initially formulated according to the measurements. For example, according to the measurements, viscoplastic, viscoelastic, elastic, yielding, yield hardening, failure/damage or other behavior may be defined for the model. Isotropic, anisotropic and orthotropic behaviors may also be defined. Some other exemplary considerations may include: cyclic compression, cyclic shear, cyclic tensile, monotonic compression, monotonic shear, monotonic tensile, cyclic triaxial compression, monotonic triaxial compression, volumetric moisture expansion, linear moisture expansion, poisson ratio, compression relaxation, shear relaxation, tensile relaxation, shear creep, compression creep, tensile creep, monotonic compression, a partial relaxation and reload, linear thermal expansion, volumetric thermal expansion, or combinations thereof. After the model is formulated, additional tests may be performed, if necessary, as determined at block 308.

At block 310, variations may be defined for the model defined at block 306. For instance, a coefficient or other variation may be added, adjusted or removed according to a comparison of the results of a simulation performed using the model defined at block 306 and the test results determined at block 304. After deriving any variations suggested by the test results at block 310, the method 310 proceeds to block 312, wherein it is determined if the model is acceptable. If the model is not acceptable, the method 300 may return to blocks 304 and 306 for additional testing and/or model definition. If the model is acceptable, the method 300 may end.

Having thus provided a constitutive model for a fibrous material that may be made into a tampon product, or, more generally, a constitutive model for a material that may be made into a product, it was further considered if such a model could provide values that were not measured in a physical sense, and, in fact, may not even be physically measurable, but that could be used to relate the material or the product to the process. It was also considered if these values could be used to predict measurements of properties of the material or the product, given processing conditions, or vice versa. That is, it was considered if the model could be used to determine what processing conditions would be required to result in certain measurements for properties of the product, or what the measurements for certain properties of the material would be required or of the product would result if certain processing conditions were used. The values, which are not physically measured and which may even not be physically measurable, but which have the ability to predict processing conditions or measurements of properties of the material or the product, may be referred to herein as virtual outcomes or virtual outcome values.

Figure 7:
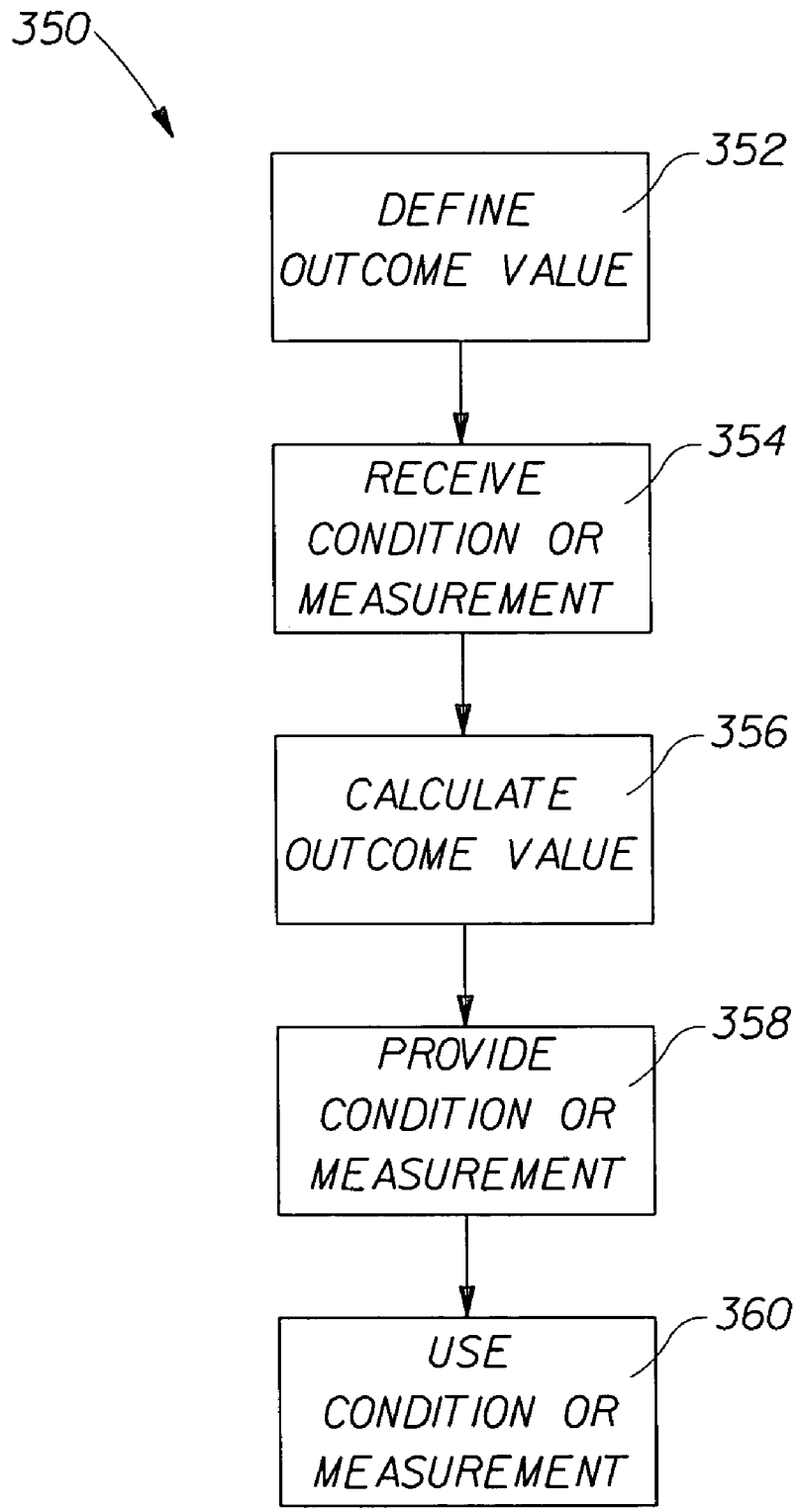
FIG. 7 is a flowchart of a predictive method that relates process, material and product.

A predictive method 350 is illustrated in FIG. 7. According to the method 350, a virtual outcome is defined at block 352. As noted above, a virtual outcome is a value that is not physically measured, and may not be physically measurable. Moreover, the virtual outcome value is one that may be related to the process used to make a material (e.g., a pledget) into a product (e.g., a tampon), and that may be related to a measurement of a property of the material or the product. It is not necessary that the relationship between the virtual outcome value and the processing condition be the same as the relationship between the virtual outcome value and the measurement of the property of the material or product. It may well be that the outcome value may have a direct relationship to the processing condition, and an indirect relationship to the property measurement. Moreover, the nature of the relationship need riot be the same for outcome value and processing condition and for outcome value and property measurement; for example, one relationship may be linear, and the other exponential or logarithmic, or vice versa.

At block 354, one of a processing condition and a measurement of a response of the material or product is received from a user. From the condition or measurement received, an outcome value or a set of outcome values (e.g., an outcome value gradient) is calculated at block 356. This calculation may be performed in conjunction with other processing conditions or measurements that have been received from the user. Moreover, the disclosure also encompasses situations wherein the processing condition or measurement received from the user is combined with other processing conditions or measurements not provided by the user.

At block 358, the method 350 provides an output in accordance with the input received. That is, if a measurement of a property of a material or a product is received, then a processing condition may be provided by the method 350, according to the virtual outcome value (or values) calculated. Alternatively, if a processing condition is received, then a measurement of a property of a material or a product may be provided, again according to the virtual outcome value (or values) calculated. In this sense, the virtual outcome value allows the user to predict a processing condition or a physical measurement of a property, one from the other, using a value that is not physically measured or may even not be physically measurable, but which has a relationship to both the process and the property. The significant importance of such values cannot be overlooked, in light of the "trial and error" methodology that preceded the present method and system, the former methodology have been expensive to perform both in hours and resources used.

At a block 360, the processing condition or measurement generated using the virtual outcome may be used by user. For example, if a processing condition is provided by virtue of the operation of the method 350, then the process by which the material is made into the product may be varied according to the processing condition provided at block 358. That is, if the process lacks such a processing condition previously, then the process may now include the processing condition provided, or if the process included a similar processing condition, then the existing processing condition may be modified in keeping with the provided processing condition. Similarly, if a measurement of a material or product is provided at block 358, then the use that may be made of the measurement is the selecting of a material according to the measurement. Alternatively, materials manufactured according to present technology may not be able to exhibit the property to the extent of the measurement provided. In such a case, the measurement may be used as the impetus for further development of materials that would have similar or the same measurements as that provided by the method 350 for the property under consideration.

It will be noted that several virtual outcomes of interest have already been identified. These virtual outcomes include local density gradient, stored energy gradient, plastic loss gradient, and pore structure gradient. These virtual outcomes are provided by way of illustration, and not by way of limitation, and may be added to in the future.

Local Density Gradient

One virtual outcome value that may be of non-physical measurements, while being physically measurable, is a density gradient. Through processing (for example, in the tampon embodiment described above, compression, both in the jaw or cross-die and in the axial direction as caused by the push rod), a low density fiber mat may be compressed to a higher density state. However, a single homogeneous density generally may not exist. Bends, buckles, friction, mass variations, prior embossing during strand making (resulting in inherently inhomogeneous webs), and shearing behavior may cause heterogeneous zones of higher and lower density regions. The density gradient is thus a set of localized or local density values in a given direction or along a given axis.

The density gradient represents a set of values that relate processing conditions to responses. As noted above, the density gradient will be a product of the processing steps applied to the fiber mat as it is processed from pledget to tampon. The density gradient is also related to the responses of the tampon, in that the openness of the tampon zones are a critical factor in determining the fluid handling rate and capabilities in such zones. Consequently, the density gradient represents a potential for relating processing conditions to tampon responses, and to allow prediction of measurements from processing conditions, and vice versa.

Pore Structure Gradient

Another virtual outcome value that may be of non-physical measurements, while being physically measurable, is a pore structure gradient. Through the tampon making operation, a low density mat, with relatively high permeability and low capillary strength can be operated upon to create a denser structure. The resulting tampon can have a modified permeability and capillary strength due to changes in the pore structure. Based upon knowledge of the incoming structural properties (fiber size, type, orientation, surface energy, and the like) of the fiber mat, and via the virtual model determine the alterations through the body of the tampon, we can obtain the pore structure gradient through the body of the tampon. This enables the user to know the capillary strength and permeability gradients.

Like local density, this value has its basis for calculation in the processing conditions used to form the pledget into a tampon, and may be related to physically-measurable characteristics of the tampon. Consequently, this value also may be used to predict physical measurements of the responses of the tampon product according to the processing conditions used, and to predict processing parameters necessary to create a tampon product with given physically-measurable responses.

Stored Energy Gradient

The first of the virtual outcome values described herein that may not be physically measurable, at least as presently considered, as well as not being physically measured, is the stored energy gradient. Stored energy, also referred to as residual stress, is the potential energy remaining in a structure (e.g., a fiber body/tampon) after, for example, it has been compressed and any stress relaxation techniques (e.g., heating, with or without moisture addition) have been applied. The compression typically creates the potential energy, while the relaxation techniques dissipate some of the energy, through stress relaxation of the fiber and fiber web stress, for example. A stored energy gradient refers to the stored energy levels along any axis. For example, one might discuss a stored energy gradient running along the tampon (i.e., the axial stored energy gradient).

Thus, the stored energy represents a value (or, if in the form of the gradient, a set of values) that relate the process to the response of the product, and vice versa. That is, the stored energy may have its origins in the processing of the material (e.g., pledget) into a product (e.g., tampon): variation of compression parameters and stress relaxation parameters may be involved in its calculation. On the other hand, the stored energy may also be related to response of the product: fiber swelling and disruption of hydrogen bonds may lead to dissipation of the energy. As a consequence, given the processing conditions for compression and relaxation, a stored energy may be calculated, and then used to predict a physical measurements, such as expansion, and vice versa.

Plastic Loss Gradient

The plastic loss gradient is also a virtual outcome value that may not be physically measurable as well as not physically measured, at least as presently considered. The plastic loss is a representation of inputted energy that is not recoverable. Plastic loss is associated with the fiber/fiber web's resistance to moving back to its original shape/position, and thus this value is not directly associated with tampon expansion, but rather with the inhibition of expansion. It is believed that the plastic losses may be significant to forming a stable tampon, via forming equilibrium with the stored energy in the fiber/fiber mat/tampon, such that the tampon is stable until fluid is added via use. As was the case above, the plastic loss gradient is a set of plastic loss values in a given direction, or along a given axis.

As above, this value has its basis for calculation in the processing conditions used to form the pledget into a tampon. However, as also explained above, the value also may be related to physically-measurable characteristics of the tampon, such as expansion. Consequently, this value also may be used to predict physical measurements of the responses of the tampon product according to the processing conditions used, and to predict processing parameters necessary to create a tampon product with given physically-measurable responses.

Viscous Loss Gradient

Viscous loss involves energy loss or dissipation, and may not be physically measurable, at least as presently considered. In particular, viscous loss is a representation of reversible loss of stored energy. That is, if an expansion force is present, it will "viscously" move as driven by the force (e.g., the energy released from the stored energy gradient). The viscous loss may be temperature and moisture sensitive, and is believed to equilibrate the forces required to make a stable tampon. The viscous loss gradient is a set of viscous loss values in a given direction, or along a given axis.

Here as well, this value has its basis for calculation in the processing conditions used to form the pledget into a tampon. However, as also explained above, the value also may be related to physically-measurable characteristics of the tampon. Consequently, this value also may be used to predict physical measurements of the responses of the tampon product according to the processing conditions used, and to predict processing parameters necessary to create a tampon product with given physically-measurable responses.

Figure 8:
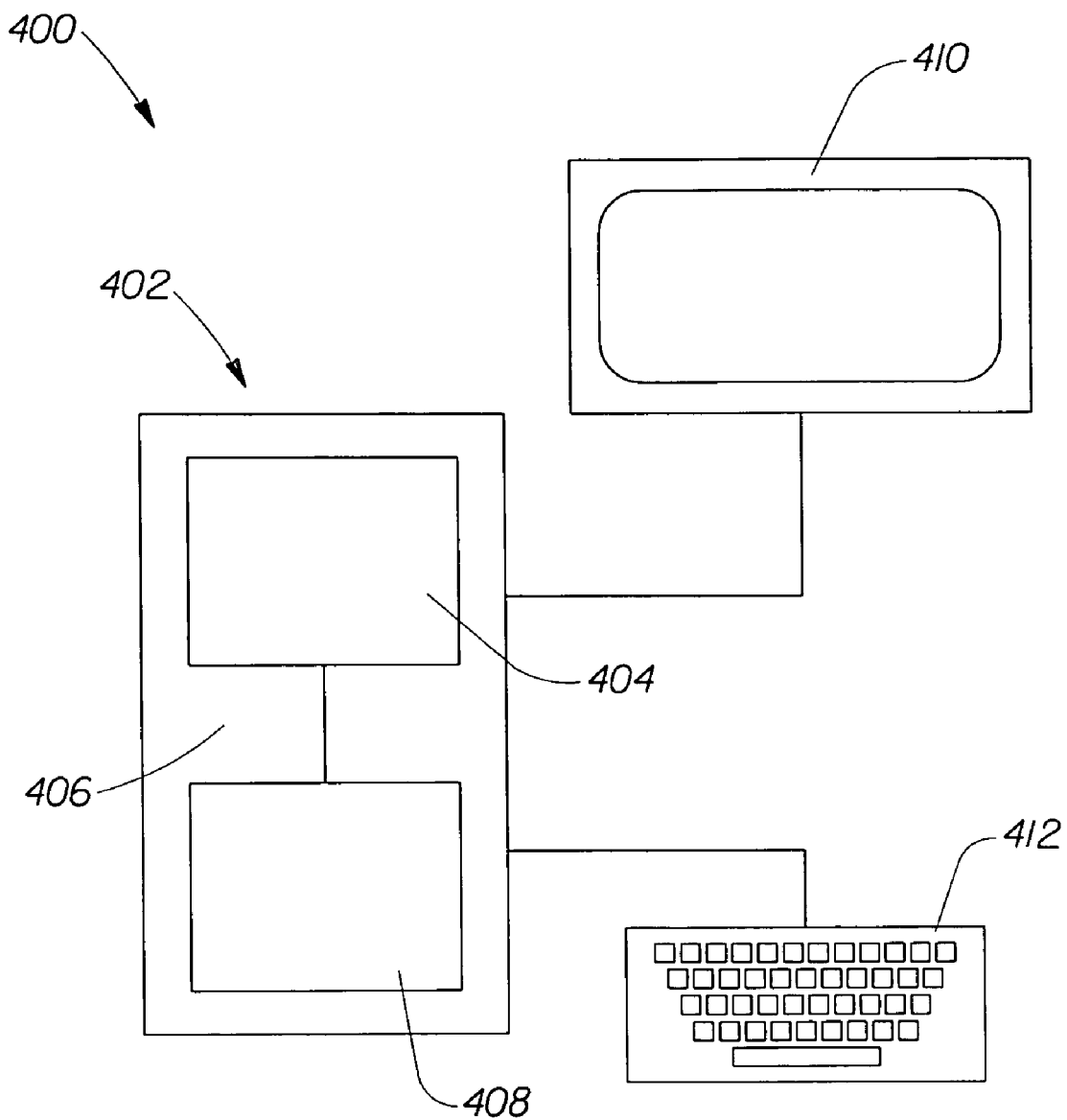
FIG. 8 is a schematic of a system for carrying out the modeling methods disclosed herein.

Turning now to FIG. 8, a system 400 is provided for utilizing the models defined by the methods 200, 300, and 350. In particular, the system 400 includes computing device 402, such as a computer. However, this is merely by way of illustration and not by way of limitation, for the computing device 402 may include a workstation, Linux machine, or any other computing device.

The computing device 402 may include one or more processors 404, which may themselves include one or more logical and/or physical processors. The processor 404 may be operatively coupled, via a bus 406, for example, to a memory/data storage medium 408. The computing device 402 may also be coupled to a display unit 410 (such as a cathode ray tube (CRT), a liquid crystal display (LCD) or any other type of display unit) and a keyboard 412 or other input device.

Although the processor 404 and the memory/data storage device 408 are illustrated as internal to the computing device 402, the devices need not be located in the same physical space or physically-proximate to each other. Moreover, the data storage device 408 may include a data storage medium interface (e.g., a magnetic disk drive, a compact disk (CD) drive or a digital versatile disk drive (DVD) and an associated data storage medium (e.g., a magnetic disk, a CD or a DVD). In fact, the data storage device 408 may be in the form of any machine-accessible medium.

A machine accessible medium includes any mechanism that provides (i.e., stores and/or transmits) information in a form accessible by a machine (e.g., a computer, workstation, Linux device, network device, manufacturing tool, any device with a set of one or more processors, etc.). For example, a machine accessible medium includes recordable/non-recordable magnetic, optical and solid-state media (e.g., read-only memory (ROM), programmable read-only memory (PROM), erasable programmable read-only memory (EPROM), electrically erasable programmable read-only memory (EEPROM), random access memory (RAM), magnetic disk storage media, optical storage media, flash memory devices, etc.), as well as electrical, optical, acoustical or other form of propagated signals (e.g., carrier waves, infrared signals, digital signals, etc). Stored in the data storage device 408 and executable by the processor 404 may be a model, as defined above, and a code, which performs the numerical solution of the model.

Thus, in this fashion, the method as defined according to the methods provided above in FIGS. 5-7 may be carried out by the system of FIG. 8.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm".

All documents cited in the Detailed Description of the Invention are, are, in relevant part, incorporated herein by reference; the citation of any document is not to be construed as an admission that it is prior art with respect to the present invention. To the extent that any meaning or definition of a term in this written document conflicts with any meaning or definition of the term in a document incorporated by reference, the meaning or definition assigned to the term in this written document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A computer-aided modeling method for predictive modeling of a tampon product, the method comprising:
   receiving a processing condition of a process used to make a fibrous material into the tampon product;
   calculating a virtual outcome from the processing condition,
   the virtual outcome being one or more of not physically measured or not physically measurable,
   the virtual outcome having a relationship to the processing condition and a relationship to a measurement of the property of the fibrous material or the tampon product; and
   providing an output comprising the measurement of a property of the fibrous material or the tampon product, according to the virtual outcome calculated.

2. A modeling method according to claim 1, wherein the virtual outcome is one of a local density, a stored energy, a plastic loss, or a pore structure.

3. A modeling method according to claim 1, comprising:
   calculating a set of virtual outcomes from the processing condition received; and
   providing an output comprising the measurement of a property of the fibrous material or the tampon product, according to the set of virtual outcomes calculated.

4. A modeling method according to claim 3, wherein the set of virtual outcomes defines a virtual outcome gradient.

5. A modeling method according to claim 1, in combination with:
   selecting a fibrous material to make into the tampon product according to the measurement of the property.

6. A modeling system for predictive modeling of a tampon product, the system comprising:

a computer, comprising a processor and a data storage device; and a constitutive model for the tampon product, the computer being programmed to receive a processing condition of a process used to make a fibrous material into the tampon product;

the computer being programmed to perform simulations using the constitutive model to calculate a virtual outcome from the processing condition, the virtual outcome being one or more of not physically measured or not physically measurable, the virtual outcome having a relationship to the processing condition and a relationship to a measurement of the property of the fibrous material or the tampon product; and the computer being programmed to provide the measurement of a property of the fibrous material or the tampon product, according to the virtual outcome calculated.

7. A modeling system according to claim 6, wherein the virtual outcome is one of a local density, a stored energy, a plastic loss, a viscous loss or a pore structure.

8. A modeling system according to claim 6, wherein:

the computing device is programmed to perform simulations using the constitutive model to calculate a set of virtual outcomes from the processing condition received; and the computing device is programmed to provide the measurement of a property of the fibrous material or the tampon product, according to the set of virtual outcomes calculated.

9. A modeling system according to claim 6, wherein the set of virtual outcomes defines a virtual outcome gradient.

10. A computer-aided modeling method for predictive modeling of a material that is made into a tampon product, the method comprising:

receiving a processing condition of a process used to make the material into the product;

calculating a virtual outcome from the processing condition, the virtual outcome being one or more of not physically measured or not physically measurable, the virtual outcome having a relationship to the processing condition and a relationship to a measurement of the property of the material or the product; and providing an output comprising the measurement of a property of the material or the product, according to the virtual outcome calculated.

11. A modeling method according to claim 10, wherein the virtual outcome is one of a local density, stored energy, a plastic loss, a viscous loss or a pore structure.

12. A modeling method according to claim 10, comprising:

calculating a set of virtual outcomes from the processing condition received; and providing an output comprising the measurement of a property of the material or the product, according to the set of virtual outcomes calculated.

13. A modeling method according to claim 12, wherein the set of virtual outcomes defines a virtual outcome gradient.

14. A modeling method according to claim 10, in combination with:

selecting a material to make into the product according to the measurement of the property.

15. A modeling system for predictive modeling of a material that is made into a product, the system comprising:

a computer, comprising a processor and a data storage device; and a constitutive model for the product, the computer being programmed to receive a processing condition of a process used to make a material into the product;

the computer being programmed to perform simulations using the constitutive model to calculate a virtual outcome from the processing condition, the virtual outcome being one or more of not physically measured or not physically measurable, the virtual outcome having a relationship to the processing condition and a relationship to a measurement of the property of the material or the product; and the computing device being programmed to provide the measurement of a property of the material or the product, according to the virtual outcome calculated.

16. A modeling system according to claim 15, wherein the virtual outcome is one of a local density, a stored energy, a plastic loss, a viscous loss gradient or a pore gradient.

17. A modeling system according to claim 15, wherein:

the computing device is programmed to perform simulations using the constitutive model to calculate a set of virtual outcomes from the processing condition received; and the computing device is programmed to provide the measurement of a property of the material or the product, according to the set of virtual outcome calculated.

18. A modeling system according to claim 17, wherein the set of virtual outcomes defines a virtual outcome gradient.

19. A computer-aided modeling method for predictive modeling of a tampon product, the method comprising:

receiving a measurement of a property of a fibrous material or a tampon product;

calculating a virtual outcome from the measurement received, the virtual outcome being one or more of not physically measured or not physically measurable, the virtual outcome having a relationship to a processing condition of a process used to make the fibrous material into the tampon product and a relationship to the measurement of the property of the fibrous material or the tampon product; and providing an output comprising a processing condition of a process used to make the fibrous material into the tampon product, according to the virtual outcome calculated.

20. A modeling method according to claim 19, wherein the virtual outcome is one of a local density, a stored energy, a plastic loss, or a pore structure.

21. A modeling method according to claim 19, comprising:

calculating a set of virtual outcomes from the measurement received; and providing an output comprising a processing condition of a process used to make the fibrous material into the tampon product, according to the set of virtual outcomes calculated.

22. A modeling method according to claim 21, wherein the set of virtual outcomes defines a virtual outcome gradient.

23. A modeling method according to claim 19, in combination with:

selecting a fibrous material to make into the tampon product according to the measurement of the property.

24. A modeling system for predictive modeling of a tampon product, the system comprising:

a computer, comprising a processor and a data storage device; and a constitutive model for the tampon product, the computer being programmed to receive a measurement of a property of a fibrous material or the tampon product;

the computer being programmed to perform simulations using the constitutive model to calculate a virtual outcome from the measurement received, the virtual outcome being one or more of not physically measured or not physically measurable, the virtual outcome having a relationship to a processing condition of a process used to make the fibrous material into the tampon product and a relationship to the measurement of the property of the fibrous material or the tampon product; and the computer being programmed to provide a processing condition of a process used to make the fibrous material into the tampon product, according to the virtual outcome calculated.

25. A modeling system according to claim 24, wherein the virtual outcome is one of a local density, a stored energy, a plastic loss, a viscous loss or a pore structure.

26. A modeling system according to claim 24, wherein:

the computer is programmed to perform simulations using the constitutive model to calculate a set of virtual outcomes from the measurement received; and the computer is programmed to provide a processing condition of a process used to make the fibrous material into the tampon product, according to the set of virtual outcome calculated.

27. A modeling system according to claim 24, wherein the set of virtual outcomes defines a virtual outcome gradient.

28. A modeling method for predictive modeling of a material that is made into a tampon product, the method comprising:

receiving a measurement of a property of the material or the product;

calculating a virtual outcome from the measurement received, the virtual outcome being one or more of not physically measured or not physically measurable, the virtual outcome having a relationship to a processing condition of a process used to make the material into the tampon product and a relationship to the measurement of the property of the material or the tampon product; and providing an output comprising a processing condition of a process used to make the material into the tampon product, according to the virtual outcome calculated.

29. A modeling method according to claim 28, wherein the virtual outcome is one of a local density, stored energy, a plastic loss, a viscous loss or a pore structure.

30. A modeling method according to claim 28, comprising:

calculating a set of virtual outcomes from the measurement received; and providing an output comprising a processing condition if the measurement is received, according to the set of virtual outcomes calculated.

31. A modeling method according to claim 30, wherein the set of virtual outcomes defines a virtual outcome gradient.

32. A modeling method according to claim 28, in combination with:

selecting a material to make into the product according to the measurement of the property.

33. A modeling system for predictive modeling of a material that is made into a product, the system comprising:

a computer, comprising a processor and a data storage device; and a constitutive model for the product, the computer being programmed to receive a measurement of a property of the material or the product;

the computing device being programmed to perform simulations using the constitutive model to calculate a virtual outcome from the measurement received, the virtual outcome being one or more of not physically measured or not physically measurable, the virtual outcome having a relationship to a processing condition of a process used to make the material into the product and a relationship to the measurement of the property of the material or the product; and the computing device being programmed to provide a processing condition of a process used to make the material into the product, according to the virtual outcome calculated.

34. A modeling system according to claim 33, wherein the virtual outcome is one of a local density, a stored energy, a plastic loss, a viscous loss gradient or a pore gradient.

35. A modeling system according to claim 33, wherein:

the computing device is programmed to perform simulations using the constitutive model to calculate a set of virtual outcomes from the measurement received; and the computing device is programmed to provide a processing condition of a process used to make the material into the product, according to the set of virtual outcome calculated.

36. A modeling system according to claim 35, wherein the set of virtual outcomes defines a virtual outcome gradient.

* * * * *

UNITED STATES PATENT AND TRADEMARK OFFICE
CERTIFICATE OF CORRECTION

PATENT NO. : 7,715,938 B2  
APPLICATION NO. : 11/636170  
DATED : May 11, 2010  
INVENTOR(S) : Steven Ray Gilbert et al.

Page 1 of 1

It is certified that error appears in the above-identified patent and that said Letters Patent is hereby corrected as shown below:

Title Page

Page 2,

OTHER PUBLICATIONS

Line 5, delete "Mechjanical" and insert -- Mechanical --.

Column 6

In the Table, in the Test Mode column, lines 5 and 6, delete

"Tension, Out of

Plane Comp., TD"

And insert    -- Tension, Out of Plane

Comp., TD --

Column 8

Line 51, delete " $\dot{M}$ " and insert -- $\tilde{M}$ --.

Column 12

Line 42, delete "riot" and insert -- not --.

Signed and Sealed this

Sixteenth Day of November, 2010

David J. Kappos  
*Director of the United States Patent and Trademark Office*